United States Patent [19]

Sakakibara et al.

[11] Patent Number: 4,965,625

[45] Date of Patent: Oct. 23, 1990

[54] IMAGE FORMING APPARATUS HAVING IMAGE FORMING DATA INPUTTING DEVICE

[75] Inventors: Kenji Sakakibara, Ichinomiya; Masashi Ueda, Nagoya; Shigeki Ishikawa, Nagoya; Jun Sakai, Nagoya; Takeshi Izaki, Nagoya, all of Japan

[73] Assignee: Brother Kogyo Kabushiki Kaisha, Aichi, Japan

[21] Appl. No.: 452,385

[22] Filed: Dec. 19, 1989

[30] Foreign Application Priority Data

Dec. 21, 1988 [JP] Japan ............................ 63-165920[U]
Jan. 30, 1989 [JP] Japan ..................................... 1-20408

[51] Int. Cl.$^5$ .............................................. G03B 27/72
[52] U.S. Cl. ..................................................... 355/35
[58] Field of Search ..................... 355/32, 35, 38, 77, 355/326; 364/525, 526; 356/425, 443, 404

[56] References Cited

U.S. PATENT DOCUMENTS

| | | | |
|---|---|---|---|
| 3,963,344 | 6/1976 | Hujer et al. | 355/35 |
| 4,099,862 | 7/1978 | Bickl et al. | 355/35 |
| 4,319,834 | 3/1982 | Terrill | 355/35 |
| 4,375,918 | 3/1983 | Isono et al. | 355/35 |
| 4,468,123 | 8/1984 | Miller | 355/35 X |
| 4,563,083 | 1/1986 | Shiota | 355/38 |
| 4,611,918 | 9/1986 | Nishida et al. | 355/38 X |
| 4,710,019 | 12/1987 | Terashita | 355/38 |
| 4,728,992 | 3/1988 | Vinatzer et al. | 355/35 |
| 4,809,198 | 2/1989 | Terashita | 355/35 X |
| 4,875,073 | 10/1989 | Ueda et al. | 355/35 X |
| 4,912,503 | 3/1990 | Sawaki et al. | 355/35 |
| 4,924,255 | 5/1990 | Horaguchi et al. | 355/35 X |

Primary Examiner—Richard A. Wintercorn
Attorney, Agent, or Firm—Oliff & Berridge

[57] ABSTRACT

An image forming apparatus comprising an image data inputting device for inputting image forming data to the image forming apparatus, a control unit for adjusting operational conditions such as an amount of light of a light source, an insertion amount of color filters into a light path and so on in the image forming appartus for performing the copying processes on the basis of the image forming data and a mode switching unit for selecting one of a first mode for roughtly inputting the image forming data and a second mode for minutely inputting the image forming data. For an adjustment of a color balance, the image forming data inputting device comprises a first input unit for inputting a first data representing a color selected from a first color gradation and a second input unit for inputting a second data representing a color selected from a second color gradation, the first and second color gradations being defined between red and green and between yellow and blue, respectively, and the control unit adjusts the color balance of the image to be copied on the basis of the first and second data to obtain the copied image having a desired color balance.

20 Claims, 5 Drawing Sheets

ROUGH ADJUSTMENT MODE

FINE ADJUSTMENT MODE

IMAGE FORMING APPARATUS HAVING IMAGE FORMING DATA INPUTTING DEVICE

BACKGROUND OF THE INVENTION

This invention relates to an image forming apparatus, and more particularly to an image forming apparatus having an image forming data inputting device for inputting data on image forming conditions such as light and darkness, density, color balance (tone), etc. for an output image to an image forming apparatus such as a copying machine.

In a conventional image forming apparatus for recording or copying an image, an user inputs data on image forming conditions such as, light and darkness ( density ) of an image to be copied, color balance (tone) of the copied image to the image forming apparatus by manually operating a panel unit provided at the front portion of the apparatus. Such a panel unit is provided with various switches for inputting the data and display units for displaying the input data. In order to accurately input the image forming data to the apparatus, another (auxiliary) panel unit having thereon various finely-adjustable switches and display units for inputting a minute image forming data is further provided in the apparatus. That is, the conventional image forming apparatus is separately provided with two types of panel units for accurately inputting the image forming data ( a main panel display for inputting a rough image forming data and an auxiliary panel display for inputting the minute image forming data). This separate arrangement of the panel units in the conventional image forming apparatus has caused an increase of cost and has hindered the apparatus from being miniaturized. Further, since the two types of panel units (the main and auxiliary panel units) are different in an operation manner, two kinds of methods for operating the main and auxiliary panel units, respectively, must be understood by the user and therefore an erroneous operation by the user is liable to occur.

Moreover, in a case of inputting data on color balance, that is, adjusting the color balance to make a color tone of a copied image coincident with that of an original image, the insertion amount of each color filter of the filter unit to a light path is automatically adjusted on the basis of the color balance (tone) data which is indicated by the user. That is, in the conventional device for inputting the color balance data to the image forming apparatus, reproduction of color is performed on the basis of a color principle in which the reproduction of the color is performed by changing a mixing ratio of three primary colors (Yellow, Magenta and Cyan) for color materials, and therefore the conventional image forming apparatus is so designed that an adjustment between the three primary colors (Yellow, Magenta and Cyan) for the color materials and the complementary colors thereof is performed on the basis of the color principle. In more detail, the conventional image forming apparatus is provided with three adjustment units, a first adjustment unit for adjusting the degree of color change between Cyan and the complementary color thereof (Red), a second adjustment unit for adjusting the degree of color change between Magenta and the complementary color thereof (Green) and a third adjustment unit for adjusting the degree of color change between Yellow and the complementary color thereof (Blue), and the user operates these adjustment units to perform the adjustment of the color balance. As described above, the adjustment operation of the user is carried out on the basis of the color principle, but not on the basis of the sensory perception of the user to color, so that it is difficult for an user having no or a little knowledge or experience on color to input the color balance data to the image forming apparatus.

SUMMARY OF THE INVENTION

An object of this invention is to provide an image forming apparatus having an image forming data inputting device in which a data inputting operation is easily performed by an user and an erroneous operation of the user is remarkably reduced.

Another object of this invention is to provide an image forming apparatus having an image forming data inputting device which can be miniaturized and the cost of which is reduced.

Still another object of this invention is to provide an image forming apparatus having an image forming data inputting device in which an adjustment of image forming conditions is easily performed even by an user having no or a little knowledge or experience on the adjustment of the image forming conditions, particularly on the adjustment of color balance.

The above objects are attained by provision an image forming apparatus according to one aspect of this invention, comprising image forming data inputting means comprising a first input unit for inputting a first data representing a color selected from a first color gradation and a second input unit for inputting a second data representing a color selected from a second color gradation, the first and second color gradations being defined between any two colors of primary three colors (red, green and blue) and between the other color and a complementary color thereof, respectively and control means for receiving the first and second data and adjusting the color balance of the image to be copied on the basis of the first and second data to obtain the copied image having a desired color balance.

The above objects are also attained by provision of an image forming apparatus according to another aspect of this invention, comprising image forming data inputting means for inputting an image density data representing a light and darkness of the image to be copied, control means for adjusting the light and darkness of the image to be copied on the basis of the image density data, and mode switching means for selecting one of a first mode for roughly inputting the image density data and a second mode for minutely inputting the image density data.

The above objects are also attained by provision of an image forming apparatus according to another aspect of this invention, comprising image data inputting means for inputting the image forming data to the image forming apparatus, control means for adjusting an operational condition of the image forming apparatus on the basis of the image forming data, and mode switching means for selecting one of a first mode for roughly inputting the image forming data and a second mode for minutely inputting the image forming data.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE INVENTION

Figure 1:
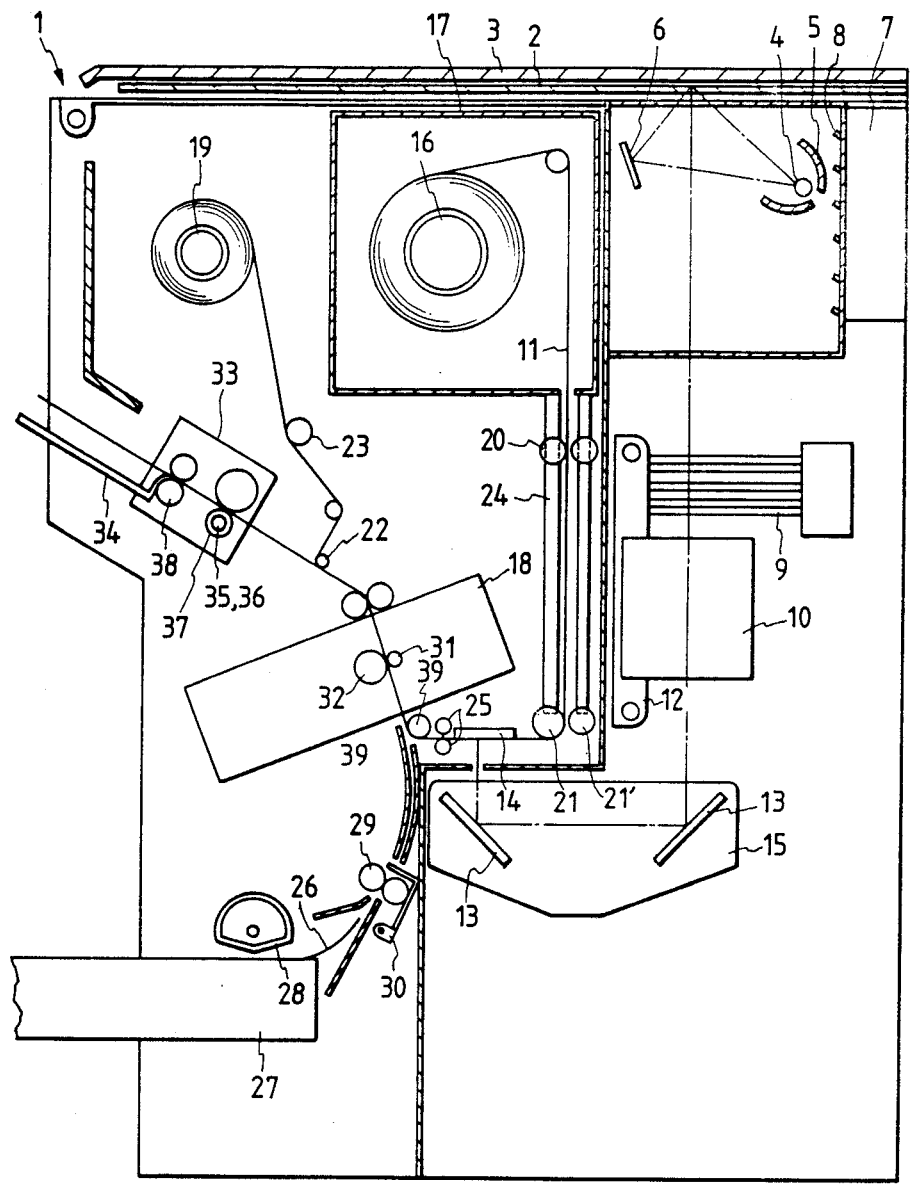
FIG. 1 shows a full-color copying machine in which an image forming data inputting device according to this invention is mounted.

FIG. 1 shows a full-color copying machine in which an image forming data inputting device according to this invention is mounted. This copying machine employs a transfer type image recording sheet including a microcapsule sheet 11 and a developer sheet 26.

As shown in FIG. 1, the copying machine 1 has its top plate portion provided with a stand cover 3 and a movable original support stand glass 2 . The original support stand glass 2 is formed of light transmissive material and is movable in the horizontal direction and on which a desired original (not shown) is to be placed face down. Further, at the upper one side section (right side in FIG. 1) of the copying machine 1, fixedly provided is a light source including a linear halogen lamp 4 extending in the direction perpendicular to the moving direction of the original support stand glass 2, and a semi-cylindrical reflector 5 disposed to surround the lamp 4.

As described hereinafter, the lamp 4 is controlled by the inputting device according to this invention so that an amount of light emitted from the lamp 4 (hereinafter referred to as "light-amount of the lamp 4") is substantially equal to a desired one to obtain a copied image having a desired image density (light and darkness). The light source emits a linear-line light ray to the original support stand glass 2. The light emitted from the halogen lamp 4 can be sequentially irradiated on the entire surface over the region from one(left) end to another(-right) end of the original support stand glass 2 in synchronism with the horizontal movement of the glass 2 to perform an operation of scanning the original with light. The light from the light source passes through the transparent original support stand glass 2 and then is reflected from the original mounted thereon. The original stand cover 3 which covers the top surface of the glass 2 is provided in order to prevent this light from leakage out of the apparatus.

To irradiate the light from the halogen lamp 4 on the original at a high efficiency, a reflector 6 is disposed on one(left) side of the light source. The reflector 6 is adapted to reflect lights which do not directly propagate toward the original from the light source and concentrate such reflected light onto the original.

At another (right) side of the halogen lamp 4 there are provided a fan 7 and a louver 8 for introducing an external air into the apparatus. Accordingly, air is effectively impinged onto the light source 4 and the original support stand glass 2 to cool the same.

A filter unit 9 comprising three color filters (for example, yellow, cyan and magenta) is disposed below the original support stand glass 2. Further, a lens 10 is provided below the filter unit 9. Light emitted from the halogen lamp 4 and reflected at the original placed on the original support stand glass 2 passes through the filter unit 9 and enters the lens 10. The color filters are provided in the copying machine 1 such that they are independently movable into and out of a light path of the reflected light from the original to thereby alter the light transmissive characteristic, that is, adjust the color balance (color tone) of an image to be copied in accordance with data inputted by an user through the inputting device according to this invention. The amount of insertion of each color filter of the filter unit 9 is controlled by a control unit as described hereinafter to adjust the color balance (tone) of an image to be copied. The lens 10 is fixedly secured to a lens mounting plate 12, and fine angular adjustment of this lens with respect to the light path is achievable. A pair of reflection mirrors 13 are provided below the lens 10. The condensed lights passing through the lens 10 change their direction by 180 degrees (completely reverse direction) by the two reflection mirrors 13 and the thus oriented lights impinge on the photosensitive sheet 11 closely contacting the under surface of an exposure table 14 to form the latent image thereon. The two reflection mirrors 13 are fixedly mounted to a mirror mounting plate 15, so that the adjustment of the length of the light path and focusing adjustment can be effected by fine adjustment of the position of the mirror mounting plate 15.

As shown in FIG. 1, the elongated photosensitive recording sheet (microcapsule sheet) 11 is wound around a cartridge shaft 16, and is retained in a photosensitive sheet cartridge 17 that is detachably disposed at a position immediately below an original support stand glass 2. In other words, the cartridge 17 storing therein non-light exposed photosensitive sheet 11 is positioned at an upper portion of the apparatus 1. A leading end of the sheet 11 passes through a number of rollers and a pressure developing unit 18, and attached to a take-up shaft 19 positioned beside the sheet cartridge 17. The photosensitive recording sheet 11 fed through a sheet outlet at the lower portion of the cartridge 17 is guided along a guide path 24 to an exposure region below the exposure stand 14 by a feeding roller 20, a barrel roller 21 and a nip roller 21', and then passed through the exposure region, sheet feeding rollers 25 and a dancer roller 39 to the pressure developing unit 18 which includes a small diameter(pressure) roller 31 and a backup roller 32. The guide path 24 is used for guiding the photosensitive recording sheet 11 therealong and shielding the non-exposed photosensitive recording sheet 11 from light. The sheet feeding rollers 25 is used to provide a constant feeding speed of the photosensitive recording sheet 11. This speed is coincident with a horizontally moving speed of the original support stand glass 2, so that a latent image corresponding to a part of the original image on a line is sequentially formed on the photosensitive recording sheet 11. Further, the dancer roller 39 is movable in a vertical direction and is used to compensate a difference between the feeding speeds of the photosensitive recording sheet 11 in the exposure region and in the pressure developing unit 18.

At downstream side of the pressure developing unit 18, a separation roller unit 22 which provides a meandering sheet pass is provided, whereby the photosensitive sheet 11 is separated from a developer sheet 26. The separate photosensitive sheet 11 is taken-up by the take-up shaft 19 through a meander travel control roller 23. On the other hand, a heat-fixing unit 33 is provided at the downstream side of the separation roller 22. The heat-fixing unit 33 includes a heating unit for heating the developer sheet 26 carrying an output color image. Further, a discharge tray 34 is provided at the downstream side of the heat-fixing unit 33.

At a lower portion of the apparatus 1, there is provided a developer sheet cassette 27 for storing therein a stack of the developer sheets 26. Immediately above the cassette 27, a sector roller 28 is provided to feed the developer sheets 26, toward the pressure developing unit 18 one by one. Between the cassette 27 and the pressure developing unit 18, a roller 29 and a resist-gate 30 are provided so as to align leading edge of the developer sheet 26 and feed the developer sheet 26 to an sheet inlet of the pressure developing unit 18.

The photosensitive recording sheet 11 and the developer sheet 26 are fed to the pressure developing unit 18 while closely contacted with each other. The microcapsule carrying surface of the photosensitive recording sheet 11 on which a latent image is formed contacts the developer-coated surface of the developer sheet 26 at a position inside the pressure developing unit 18, and these superposed sheets are pressed together by the small roller 31 and the backup roller 32. Unexposed microcapsules are ruptured by the applied pressure, to thereby form an output image (visible image) on the developer sheet 26 by the reaction of chromogenic material with the developer material. The photosensitive recording sheet 11 and the developer sheet 26 which are fed out of the pressure developing unit 18 are separated from each other by the separation roller 22. The developer sheet 26 separated from the photosensitive recording sheet 11 is fed to the heat-fixing unit 33, and the coloring of the image on the developer sheet 26 is promoted to form an image on the developer sheet 26. The heat-fixing unit 33 comprises a hollow heat roller 37 including a heater 35 and a temperature sensor 36 therein and a developer sheet feeding roller 38. The developer sheet 26 having a color image thereon is discharged to the discharge tray 34.

In addition to the above elements, an image forming data inputting device according to this invention is provided to the image forming apparatus as shown in FIG. 1. The inputting device may be provided in any form and at any position of the image forming apparatus, however, it is provided preferably in a panel form and at the top and front portion of the apparatus.

Prior to describing the construction and operation of the image forming data inputting device according to this invention, sensory perception of human to color will be described hereunder.

Figure 2:
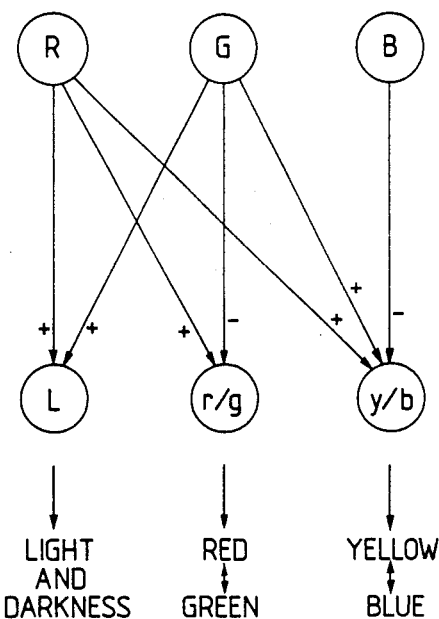
FIG. 2 is an explanatory diagram for showing the sensory perception of human to color.

FIG. 2 is an explanatory diagram for showing the sensory perception of human to color. The sensory perception of human to color is performed by the following process in a human body.

Light incident to a retina of a human is absorbed by three types of photosensitive elements having different spectral sensitivities which are called as petrosal, and converted into the respective three types of signals by the photosensitive elements. Thereafter, the respective signals outputted from the respective photosensitive elements are processed by an optic nerve system and then is transmitted to the cerebrum. The above process is represented by the following equation.

$$L=R+G, \ r/g=R-G, \ y/b=R+G-B$$

As shown in FIG. 2, three primary-color components of Red, Green and Blue constituting the incident light are perceived by the optic nerve system of the human, and the perceived results (R, G and B) are processed into three types of perceptible elements (L, r/g and y/b). The elements L, r/g and y/b allows the human to perceive the difference in light and darkness, the difference in color tone between red and green and the difference in color tone between yellow and blue, respectively, and therefore the combination thereof allows the human to perceive a color. The above model of sensory perception of the human to color is broadly well known in the art, and is described in a collection of papers in THE FOURTH COLOR ENGINEERING CONFERENCE, published by Kogaku yongakkai Kanjikai, pp 87–94. According to the above model, it is understood that the human can easily discriminate the differences in color tone between red and green and between yellow and blue.

This invention is made on the basis of the above model, and the preferred embodiments of this invention will be described hereinafter.

Figure 3:
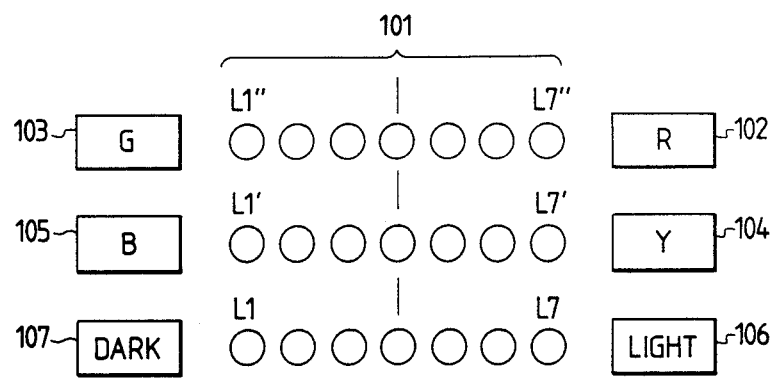
FIG. 3 shows a panel portion of one embodiment of the image forming data inputting device which is provided on the operation panel of the image forming apparatus.

FIG. 3 shows a panel portion of one embodiment of the image forming data inputting device which is provided on the operation panel of the image forming apparatus.

The image data inputting device of this embodiment comprises plural switches 102 to 107 for adjusting the color tone (color balance) and the light and darkness of an output image (an image to be copied) of the image forming apparatus, and plural displays comprising light-emitting diodes (LEDs) 101 for indicating the color balance (tone) and the light and darkness of the output image. The light and darkness of the output image corresponds to an image density of the output image, and therefore the LEDs 101 indicate the color balance (tone) and the image density of the output image (the image to be copied) by the image forming apparatus as shown in FIG. 1.

In the following description, the image forming data inputting device will be representatively described particularly when the color balance (tone) data is inputted and when the image density data is inputted. However, any other image forming data such as a pressure for a pressure-development process in the pressure-developing unit, a temperature for a heat-fixing process in the heat-fixing unit and so on may be inputted in accordance with the following embodiments.

The image forming data inputting device according to the following embodiment is capable of inputting both of a color balance (tone) data and an image density data to the image forming apparatus. In order to perform the above two functions, the image forming data inputting device includes two control units for independently performing adjustments of the color balance and the image density, or a single control unit for collectively performing both of the adjustments. Further, the light and darkness of the image to be copied is adjusted by the following two methods: the insertion amount of the color filters into the light path of the reflected light from the original is changed with a ratio of the insertion amounts of the filter unit 9 to one another being set to a constant value, and the amount of light of the light source is changed. In the following embodiment, the light and darkness of the image to be copied is adjusted by changing the insertion amount of the filter unit 9, and therefore the color balance (tone) and the light and darkness of the copied image is adjusted by the image forming data inputting device having a single control unit.

As shown in FIG. 3, the image forming data inputting device has plural switches 102 to 105 (R, G, Y and B) and plural light-emitting diodes therebetween for inputting the color balance (tone) data. The G switch 103 for green color and the R switch 102 for red color are disposed at the upper portion of the operation panel such that those switch are horizontally aligned with each other. Similarly, the B switch 105 for blue color and the Y switch 104 for yellow color are disposed at the intermediate portion of the operation panel such that those switches are horizontally aligned with each other. The seven LEDs L1" to L7" and the other seven LEDs L1' to L7' are horizontally disposed between the G switch and the R switch and between the B switch and the Y switch, respectively. The switches 106 and 107 for inputting an image density data are disposed at the lower portion of the panel such that those switches are horizontally aligned with each other.

The LEDs L1' to L7' and L1" to L7" are used to indicate the degree of color balance so that the user can detect the degree of the color balance with the naked eye, and the lighting of the LEDs 101 is successively shifted to the switch which is intermittently or continuously pushed. For example, if the G switch 103 is pushed once when the LED L4" lights, the lighting is shifted from the LED L4" to the LED L3". If the G switch 103 is pushed twice when the LED L4" lights, the lighting is shifted from the LED L4" to the LED L2". In accordance with this pushing operation of the switches 102 to 105, the insertion of each color filter of the filter unit 9 into the light path is controlled to adjust the color balance (tone) of the output image. In this case, the color filters constituting the filter unit 9 comprises, for example, three primary colors for color materials (that is, yellow, cyan and magenta). Accordingly, the R switch 102 is interlocked with the yellow and magenta filters, the G switch 103 is interlocked with the yellow and cyan filters, the Y switch 104 is interlocked with the yellow filter, and the B switch 105 is interlocked with the magenta and cyan filters to adjust the color balance (tone). For example, the insertion amount of the yellow and magenta filters are increased as a pushing operation of the R switch 102 is continued. This is also applicable to the G, B and Y switches.

Figure 4:
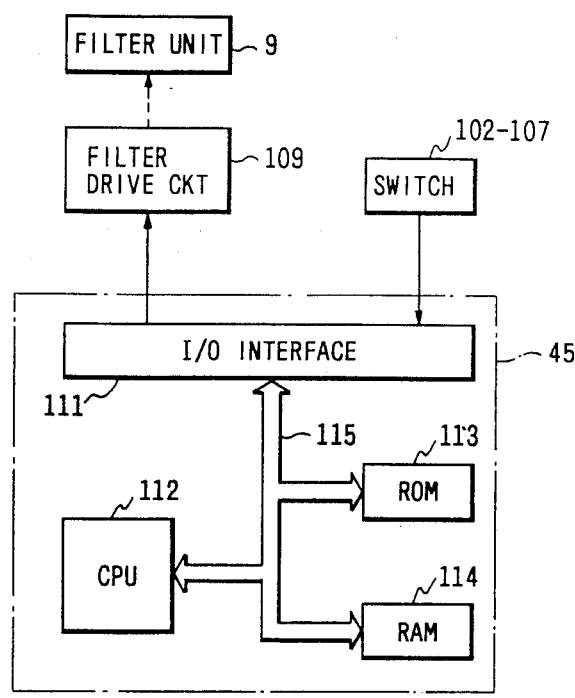
FIG. 4 is a block diagram for showing one embodiment of a control portion of the image forming data inputting device.

FIG. 4 is a block diagram for showing one embodiment of a control portion of the image forming data inputting device.

The control portion of the image forming data inputting device comprises a control unit 45 such as a microcomputer including an I/O interface 111 for receiving signals from the switches 102 to 107 for adjusting the color balance (tone) and the image density, an CPU 112 for processing the input signals, a ROM 113, a RAM 114 and a bus 115 for connecting those elements in the control unit. The control unit determines the insertion amount of the color filters of the filter unit 9 into the light path in accordance with the operation of the switches 102 to 107. In this embodiment, the image forming data inputting device is further provided with a filter driving circuit 109 for controlling the insertion of the color filters of the filter unit 9 into the light path.

In the ROM 113 is beforehand stored a table including information on the relation between the lighting position of the LEDs and the insertion amount of the color filters into the light path. The table stored in the ROM 113 is temporally developed in the RAM 114, and then the CPU 112 compares the developed table with signals from the switch 102 to 107 which represent lighting positions of the LEDs, and determines the insertion amount of the color filters of the filter unit 9 into the light path. In accordance with the compared results in the CPU 112, the filter driving circuit 109 controls the movement of the color filters into and out of the light path.

The insertion amount of the color filters may be theoretically determined on the basis of the three parameters, L, r/g and y/b as described above. However, the theoretical values are not necessarily satisfied for a practical use because an actual copying operation is affected by other parameters such as a filter characteristic, a coloring characteristic of a photosensitive recording sheet and so on. Accordingly, in the practical use, the insertion amount of the color filters is experimentally determined and the measured data obtained by the experiment are stored in the ROM 113.

As described above, according to this embodiment the adjustment of the color balance (tone) is performed on the basis of the sensory perception of the human, so that it is easily and accurately performed even by an user having a little or no knowledge on color.

This invention is not limited to the above embodiment, and any modification may be made thereto. For example, in place of provision of plural discrete LEDs, a belt type of LED may be used for indicate the degree of color balance sequentially. Further, in the above embodiment, the color balance (tone) of the image is adjusted by independently adjusting each of the degrees in color change of two pairs of the colors, that is, the degrees in color change between red and green and between yellow and blue. However, this invention is not limited to the above colors. For example, two pairs ( red and blue, green and magenta) or the other two pairs (green and blue, red and cyan) may be used to perform the color balance (tone) of the image to be copied. That is, the color balance (tone) is performed by independently adjusting each of the degrees in color change between any two colors of the three primary colors (red, green and blue) and between the other color of the three primary colors and the complementary color of the other color.

Figure 5:
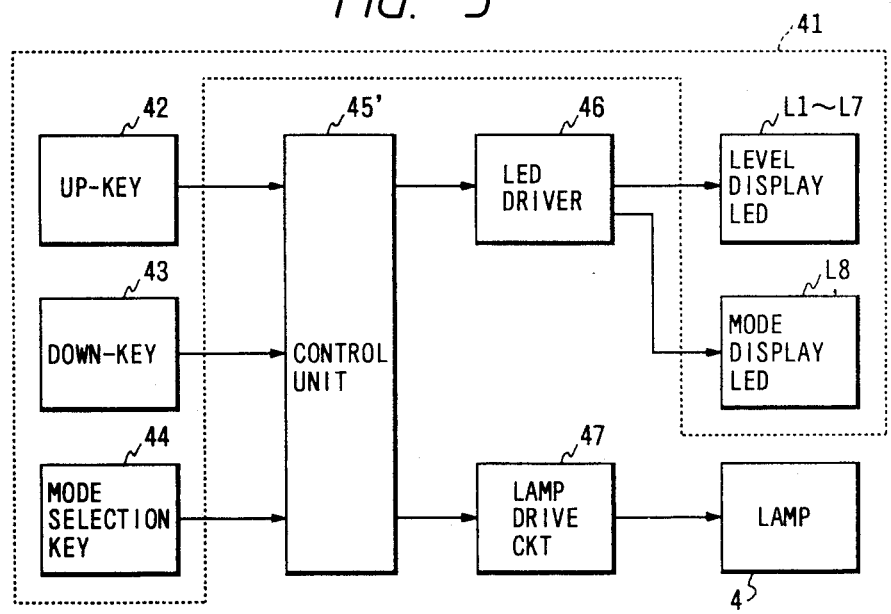
FIG. 5 shows another embodiment of the control portion according to this invention.

FIG. 5 shows another embodiment of the control portion according to this invention. The following embodiment will be described particularly when the image density (light and darkness) data is inputted and the image density is adjusted by changing the amount of light of the light source.

As shown in FIG. 5, the image forming data inputting device is provided as a panel unit 41 on the operation panel mounted on the top and front portion of the image forming apparatus 1 as shown in FIG. 1. The image forming data inputting device of this embodiment comprises an up-key 42 and a down-key 43 for adjusting an image density (light and darkness), a mode selection key 44 for selecting one of rough and fine adjustment modes, an image density display unit comprising plural light-emitting diodes (LED) L1 to L7 for stepwise displaying the image density(light and darkness) of an output image (an image to be copied) and another display unit comprising a light-emitting diode (LED) L8 lighting when the fine adjustment mode is selected, those elements being provided on the operation panel. The up-key 42 and the down-key 43 corresponds to the switches 106 and 107 as shown in FIG. 3. The inputting device further comprises a LED (light-emitting diode) driver for driving the LEDs L1 to L8, a lamp driving circuit 47 for driving the lamp 4, and a control unit 45′ including a microcomputer for receiving operation signals outputted from the up-key 42, the down-key 43 and the mode selection key 44 and controlling both of the lighting of the LEDs L1 to L8 and the light-amount of the lamp 4 which determines the density of an image to be copied through the LED driver 46 and the lamp driving circuit 47, respectively, on the basis of the operation signals.

Figure 6:
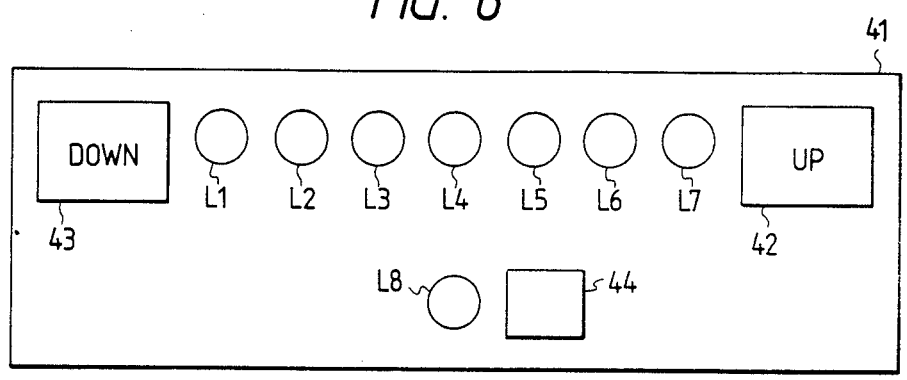
FIG. 6 shows a panel portion of the control portion as shown in FIG 5.

FIG. 6 shows as panel portion of the control portion as shown in FIG. 5 on the operation panel, and FIG. 7 is an explanatory diagram for showing the operation of inputting the image density data to the image forming apparatus.

As the down-key 43 is continued to be intermittently or continuously pushed, the lighting of the LEDs L1 to L7 is successively shifted from the right side (L7) to the left side (L1) and the light-amount of the lamp 4 is decreased in accordance with the shift of lighting of the LEDs. On the other hand, as the up-key 42 is intermittently or continuously pushed, the lighting of the LEDs L1 to L7 is successively shifted from the left side (L1) to the right side (L7) and the light-amount of the lamp 4 is increased in accordance with the shift of the lighting of the LEDs.

The LEDs L1 to L7 are designed such that in the rough adjustment mode (when the mode selection key 44 selects the rough adjustment mode) a density range indicated by each of the LEDs L1 to L7 is broad, while in the fine adjustment mode(when the mode selection key 44 selects the fine adjustment mode) the density range indicated by each of the LEDs L1 to L7 is narrow (hereinafter, the former range and the latter range being referred to as "rough density range" and "fine density range", respectively). At an initial stage of the image forming apparatus, the rough adjustment mode is beforehand selected by the mode selection key 44 and the level of the density is beforehand set to an intermediate level(that is, the LED L4 lights).

When the rough adjustment mode is switched to the fine adjustment mode through the mode selection key 44 by the user, the rough density range indicated by each of the LEDs L1 to L7 is changed to the fine density range and therefore each of the LEDs indicates the density in the fine density range with respect to the density which is set by one of the LEDs immediately before the rough adjustment mode is switched to the fine adjustment mode. Similarly in the rough adjustment mode, an intermediate level is beforehand set (that is, the LED L4 lights) immediately after the rough adjustment mode is changed to the fine adjustment mode. The control operation as described above is performed by executing a program stored beforehand in the control unit 45.

The operation of inputting the image density data to the image forming apparatus will be described in detail with reference to FIGS. 6 and 7.

When a power switch is turned on and the control unit 45 is initialized, only the LED L4 lights and the LED L8 is turned off to select the rough adjustment mode. In this state, the user continues to operate the up-key 42 or the down-key 43 with his attention being given to the density of an original image or to that of an output(copied) image until a desired density is roughly obtained.

Figure 7A:
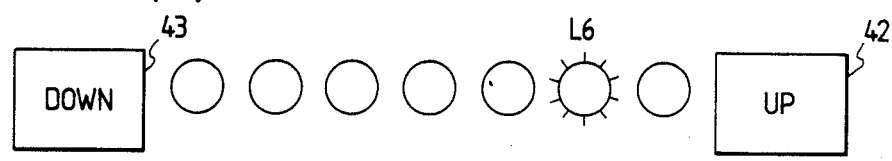
FIG. 7 is an explanatory diagram for showing the data inputting operation of the image forming data inputting device as shown in FIG. 6.
Figure 7B:
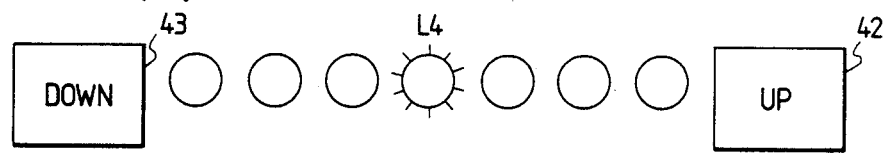
Figure 7C:
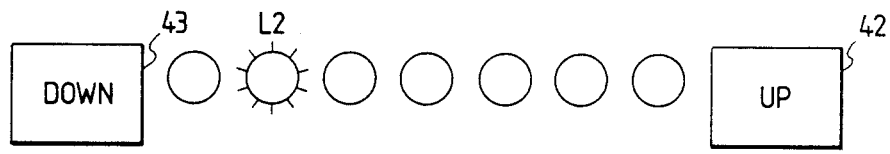

It is assumed that the rough density range indicated by the LED L6 includes the desired density, that is, the density of the output (copied) image when the LED L6 lights is most approximate to the desired density as shown in FIG. 7(a). In this case, when the further density adjustment is required, the mode selection key 44 is switched on to select the fine adjustment mode and the LED L8 is turned on to indicate the change-over to the fine adjustment mode. At the same time, the LED L6 is turned off and the LED L4 is turned on as shown in FIG. 7(b). Thereafter, the up-key 42 or the down-key 43 is operated again to finely adjust the density of the output image. Accordingly, if the density of the output image is judged as being optimum when the LED L2 lights as shown in FIG. 7(c), the density indicated by the LED L2 is substantially regarded as the desired density.

FIG. 8 is a schematic diagram showing the operation as shown in FIG. 7 when the image density is numerically represented.

Figure 8A:
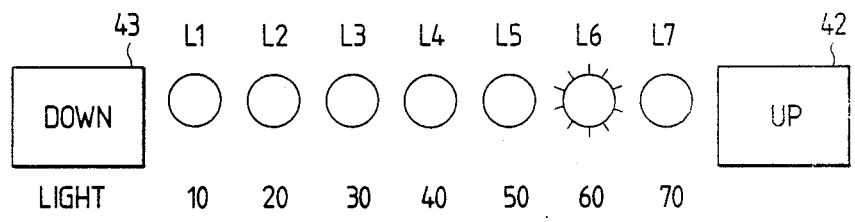
FIG. 8 is an explanatory diagram of FIG. 7 when the image forming data is assigned numerical values.
Figure 8B:
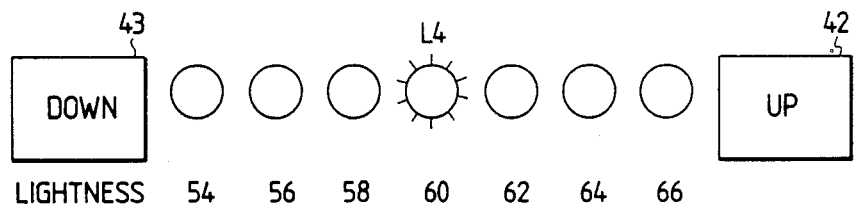

In this embodiment, each of the LEDs L1 to L7 indicates the image density such that the density range indicated by each of the LEDs in the rough adjustment mode is five times as broad as that in the fine adjustment mode. For example, it is assumed that the density for the lighting of the LED L6 in the rough adjustment mode is 60 as shown in FIG. 8(a). In this state, the mode selection key 44 is turned on (pushed) to select the fine adjustment mode, so that the LED L6 is turned off and the LED L4 is turned on to indicate on the panel unit that the image density is approximately 60, as shown in FIG. 8(b). Accordingly, each of the LEDs L1 to L7 indicates the fine image density shifted positively or negatively from the image density of 60 with the LED L4 being at the center of the density range which can be indicated by all of the LEDs L1 to L7. For example, the state as shown in FIG. 7(c) indicates that the image density is 56. Further, the fine adjustment mode may be changed back to the rough adjustment mode by turning the mode selection key 44 on.

In the embodiment as described above, the LED L8 is used to indicate the change-over of the fine adjustment mode, but in place of provision of the LED L8, the changeover of the fine adjustment mode may be indicated by light-flashing of at least one of the LEDs L1 to L7.

Further, in the above-described embodiment the inputting operation of the image density data is typically described. However, the above embodiment is applicable to the inputting operation of other image forming data such as an insertion amount of the color filter 9 to the light path reflected from the original to the exposure stand 14 for adjusting the color tone or color balance, a temperature for a heat-fixing treatment, a pressure for a pressure developing treatment and so on. In this case, various mode selection keys for inputting the above image forming data to the image forming apparatus may be independently provided, or one mode selection key which can switch all of the image forming data or a part thereof to one another may be provided.

For example, when the above embodiment are applied to the switches 102 to 107 and the LEDs 101 of the image forming data inputting data as shown in FIG. 3, each set of the switches and the LEDs which are horizontally aligned with one another may be provided with rough and fine adjustment modes. In this case, plural mode selection keys for independently switching the respective sets are provided, or a single key for switching the modes of all of sets in a lump is provided.

Still further, in the above embodiment only two modes (the rough and fine adjustment modes) are adopted. However, this invention is not limited in the number of modes. For example, in addition to the rough and fine adjustment modes as described above, plural further-fine or further-rough adjustment modes each of which indicates a finer or rougher image density range than the fine adjustment mode may be used. In this case, the mode selection key 44 should be designed so that the plural modes including the rough and fine adjustment modes as described above are switched to one another by a switching operation of the mode selection key 44.

As described above, according to this invention, the image density (light and darkness) data, the color balance (tone) data and the other data are easily inputted.

What is claimed is:

1. An image forming apparatus for inputting image forming data for an image to be copied and performing a series of copying processes on the basis of the image forming data to obtain a copied image, comprising:
   image forming data inputting means comprising a first input unit for inputting a first data representing a color selected from a first color gradation and a second input unit for inputting a second data representing a color selected from a second color gradation, said first and second color gradations being defined between any two colors of primary three colors (red, green and blue) and between the other color and a complementary color thereof, respectively; and
   control means for receiving the first and second data and adjusting the color balance of the image to be copied on the basis of the first and second data to obtain the copied image having a desired color balance.

2. An image forming apparatus as claimed in claim 1, wherein said first input unit comprises first selecting means for selecting a first desired color in said first color gradation and first display means for visually indicating the first selected color, and said second input unit comprises second selecting means for selecting a second desired color in said second color gradation and second display means for visually indicating the second desired color.

3. An image forming apparatus as claimed in claim 2, wherein each of said first and second selecting means comprises two switches and each of said display means comprises plural light-emitting diodes.

4. An image forming apparatus as claimed in claim 1, wherein said control means comprises a filter unit including three color filters for passing light therethrough and a control unit for independently moving each of said color filters and adjusting an insertion amount of each of said color filters into a light path of the light in accordance with the first and second data.

5. An image forming apparatus as claimed in claim 1, wherein the two colors are red and green, and the other color is blue.

6. An image forming apparatus as claimed in claim 1, wherein said image forming data inputting means comprises a third input unit for inputting an image density data representing a light and darkness of the image to be copied and wherein said control means further adjusts the light and darkness of the image to be copied on the basis of the image density data.

7. An image forming apparatus as claimed in claim 6, wherein said third input unit comprises third selecting means for selecting a desired image density and third display means for visually indicating the selected image density.

8. An image forming apparatus as claimed in claim 7, wherein said third selecting means comprises two switches and said third display means comprises plural light-emitting diodes.

9. An image forming apparatus as claimed in claim 6, wherein said control means further receives the image density data and comprises a light source for emitting light and a control unit for driving said light source and adjusting an amount of light of said light source to adjust the light and darkness of the image to be copied.

10. An image forming apparatus as claimed in claim 6, wherein said image forming data inputting means further comprises mode switching means for selecting one of a first mode for roughly inputting at least one of the first data, the second data and the image density data and a second mode for minutely inputting said at least one of the first data, the second data and the image density data.

11. An image forming apparatus as claimed in claim 10, wherein said mode switching means comprises a mode selection key for selecting one of the first and second modes and a mode display unit for visually indicating the selected mode.

12. An image forming apparatus as claimed in claim 11, wherein said mode display unit comprises a light-emitting diode.

13. An image forming apparatus for inputting image forming data for an image to be copied and performing a series of copying processes on the basis of the image forming data to obtain a copied image, comprising:
   image forming data inputting means for inputting an image density data representing a light and darkness of the image to be copied;
   control means for adjusting the light and darkness of the image to be copied on the basis of the image density data; and
   mode switching means for selecting one of a first mode for roughly inputting the image density data and a second mode for minutely inputting the image density data.

14. An image forming apparatus as claimed in claim 13, wherein said image forming data inputting means comprises selecting means for selecting a desired image density and display means for visually indicating the selected image density.

15. An image forming apparatus as claimed in claim 14, wherein said selecting means comprises two switches and said display means comprises plural light-emitting diodes.

16. An image forming apparatus as claimed in claim 15, wherein said light-emitting diodes visually indicate the desired color by a lighting position thereof.

17. An image forming apparatus for inputting image forming data on the adjustment of an operational condition for each of a series of copying processes in the image forming apparatus and performing the series of the copying processes on the basis of the image forming data to obtain a copied image having a desired image characteristic, comprising:

image data inputting means for inputting the image forming data to the image forming apparatus;

control means for adjusting the operational condition of said image forming apparatus on the basis of the image forming data; and mode switching means for selecting one of a first mode for roughly inputting the image forming data and a second mode for minutely inputting the image forming data.

18. An image forming apparatus as claimed in claim 17, wherein said image forming data inputting means comprises selecting means for selecting a desired operational condition providing the copied image having the desired image characteristic and display means for visually indicating the selected image density.

19. An image forming apparatus as claimed in claim 18, wherein said selecting means comprises two switches and said display means comprises plural light-emitting diodes.

20. An image forming apparatus as claimed in claim 19, wherein said light-emitting diodes visually indicate the desired operational condition by a lighting position thereof.

* * * * *